(12) United States Patent
Weaver et al.

(10) Patent No.: US 9,437,392 B2
(45) Date of Patent: Sep. 6, 2016

(54) HIGH-THROUGHPUT ION IMPLANTER

(71) Applicant: VARIAN SEMICONDUCTOR EQUIPMENT ASSOCIATES, INC., Gloucester, MA (US)

(72) Inventors: William T. Weaver, Austin, TX (US); Charles T. Carlson, Cedar Park, TX (US); Joseph C. Olson, Beverly, MA (US); James Buonodono, Amesbury, MA (US); Paul Sullivan, Wenham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 880 days.

(21) Appl. No.: 13/662,110

(22) Filed: Oct. 26, 2012

(65) Prior Publication Data

US 2013/0108799 A1    May 2, 2013

Related U.S. Application Data

(60) Provisional application No. 61/554,720, filed on Nov. 2, 2011.

(51) Int. Cl.
*H01J 37/00*    (2006.01)
*H01J 37/20*    (2006.01)
(Continued)

(52) U.S. Cl.
CPC ............ *H01J 37/20* (2013.01); *H01J 37/3023* (2013.01); *H01J 37/3171* (2013.01); *H01L 21/266* (2013.01); *H01L 21/67213* (2013.01); *H01L 31/18* (2013.01); *H01L 31/1804* (2013.01); *H01J 2237/024* (2013.01);
(Continued)

(58) Field of Classification Search
CPC .. H01J 37/20; H01J 37/3171; H01J 37/3023; H01J 2237/024; H01J 2237/31711; H01L 21/266; H01L 31/18; H01L 21/67213; H01L 31/1804; Y02P 70/521
USPC ......................................... 250/492.1–492.22
See application file for complete search history.

(56) References Cited

U.S. PATENT DOCUMENTS 4,141,458 A    2/1979  Brooks et al.
4,187,124 A    2/1980  Muller et al.
(Continued)

FOREIGN PATENT DOCUMENTS

CN    101138080 A    3/2008
CN    101964319 A    2/2011
(Continued)

OTHER PUBLICATIONS

A.J. Armini et al., A Non-Mass-Analyzed Solar Cell Ion Implanter, Nuclear Inst. & Methods in Physics Research, 1985, 94-99, B6, Elsevier Science Publishers B.V.

*Primary Examiner* — Michael Maskell
(74) *Attorney, Agent, or Firm* — Nields, Lemack & Frame, LLC (57) ABSTRACT

One embodiment of this ion implanter includes an ion source and a process chamber. This process chamber is connected to the ion source and separated from the ion source by a plurality of extraction electrodes. A carrier holds multiple workpieces. A mask loader in the process chamber connects a mask to the carrier. A transfer chamber and load lock may be connected to the process chamber. The ion implanter is configured to perform either blanket or selective implantation of the workpieces.

17 Claims, 10 Drawing Sheets

(51) Int. Cl.
  *H01J 37/302* (2006.01)
  *H01J 37/317* (2006.01)
  *H01L 21/266* (2006.01)
  *H01L 21/67* (2006.01)
  *H01L 31/18* (2006.01)

(52) U.S. Cl.
  CPC ... *H01J 2237/31711* (2013.01); *Y02E 10/547* (2013.01); *Y02P 70/521* (2015.11)

(56) References Cited

U.S. PATENT DOCUMENTS

| | | | |
|---|---|---|---|
| 4,533,831 | A | 8/1985 | Itoh et al. |
| 6,930,316 | B2 | 8/2005 | Nishihashi et al. |
| 7,727,866 | B2 | 6/2010 | Bateman et al. |
| 7,776,727 | B2 | 8/2010 | Borden |
| 7,820,460 | B2 | 10/2010 | Sullivan et al. |
| 7,888,249 | B2 | 2/2011 | Bateman et al. |
| 2005/0173656 | A1 | 8/2005 | Kaim et al. |
| 2006/0258128 | A1* | 11/2006 | Nunan ............ H01J 37/09 438/510 |
| 2010/0003768 | A1* | 1/2010 | Barnes ............ H01L 21/67069 438/4 |
| 2010/0308236 | A1 | 12/2010 | Carlson et al. |
| 2010/0314559 | A1* | 12/2010 | Vopat ............ H01J 37/3171 250/492.3 |
| 2010/0323508 | A1 | 12/2010 | Adibi et al. |
| 2011/0108742 | A1 | 5/2011 | Weaver et al. |
| 2011/0124186 | A1 | 5/2011 | Renau et al. |
| 2011/0192993 | A1 | 8/2011 | Chun et al. |
| 2012/0083102 | A1* | 4/2012 | Bateman ............ H01J 37/3171 438/527 |

FOREIGN PATENT DOCUMENTS

| | | |
|---|---|---|
| JP | 2006196752 A | 7/2006 |
| JP | 2006302528 A | 11/2006 |
| WO | 2006096818 A1 | 9/2006 |
| WO | 2010/144273 A2 | 12/2010 |

\* cited by examiner

HIGH-THROUGHPUT ION IMPLANTER

CROSS-REFERENCE TO RELATED APPLICATIONS

This claims priority to the provisional patent application entitled "High-Throughput Ion Implanter," filed Nov. 2, 2011 and assigned U.S. App. No. 61/554,720, the disclosure of which is hereby incorporated by reference.

FIELD

This invention relates to ion implantation and, more particularly, to ion implanter architectures.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Two concerns of the solar cell manufacturing industry are manufacturing throughput and cell efficiency. Cell efficiency measures the amount of energy converted into electricity. Higher cell efficiencies may be needed to stay competitive. However, manufacturing throughput likely cannot be sacrificed at the expense of increased cell efficiency.

Ion implantation has been demonstrated as a viable method to dope solar cells. Use of ion implantation removes process steps needed for existing technology, such as diffusion furnaces, which increases throughput and may lower costs. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Any improvement to manufacturing throughput of an ion implanter or its reliability would be beneficial to solar cell manufacturers worldwide. This may accelerate the adoption of solar cells as an alternative energy source.

SUMMARY

According to a first aspect of the invention, an ion implanter is provided. The ion implanter comprises an ion source and a process chamber connected to the ion source that is separated from the ion source by a plurality of extraction electrodes. A carrier is configured to hold a plurality of workpieces. A mask loader is in the process chamber. The mask loader is configured to connect a mask to the carrier.

According to a second aspect of the invention, an ion implanter is provided. The ion implanter comprises an ion source and a process chamber connected to the ion source that is separated from the ion source by a plurality of extraction electrodes. A carrier is configured to hold a plurality of workpieces. A mask loader is in the process chamber. The mask loader is configured to connect a mask to the carrier. A transfer chamber is connected to the process chamber and a load lock is connected to the transfer chamber. A transfer robot in the transfer chamber is configured to transport the plurality of workpieces between the load lock and the process chamber. A workpiece transport system is connected to the load lock and is configured to load and unload the plurality of workpieces from the load lock.

According to a third aspect of the invention, a method of ion implantation is provided. The method comprises loading a plurality of workpieces on a carrier in a matrix. A blanket implant is performed, which comprises scanning the carrier through an ion beam to implant an entirety of a surface of each of the plurality of workpieces. A mask is connected to the carrier. The mask defines a plurality of apertures and the mask at least partially covers each of the plurality of workpieces. A selective implant is performed after connecting the mask, which comprises scanning the carrier through the ion beam to implant a region of the surface of each of the plurality of workpieces through the mask.

BRIEF DESCRIPTION OF THE DRAWINGS

For a better understanding of the present disclosure, reference is made to the accompanying drawings, which are incorporated herein by reference and in which.

DETAILED DESCRIPTION

The ion implanters herein are described in connection with solar cells. However, the ion implanters can be used with other workpieces such as semiconductor wafers, light emitting diodes (LEDs), silicon-on-insulator (SOI) wafers, or other devices. Thus, the invention is not limited to the specific embodiments described below.

Figure 1:
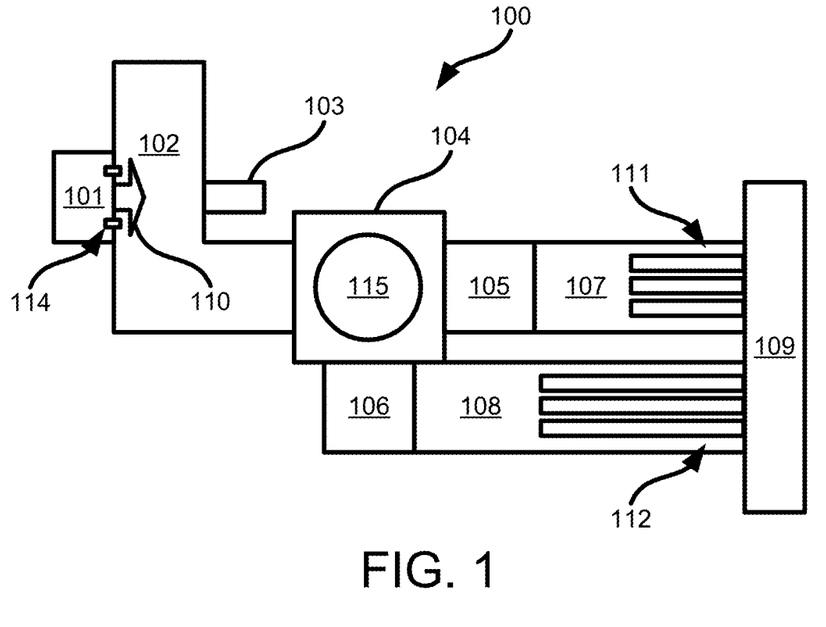
FIG. 1 is a top perspective view of a block diagram of a first embodiment of an ion implanter architecture.

FIG. 1 is a top perspective view of a block diagram of a first embodiment of an ion implanter architecture. The ion implanter 100 has an ion source 101. In one embodiment this ion source 101 is an RF plasma source that operates without mass analysis. The RF plasma source uses antennas to generate a plasma from a gas. Other ion sources, such as an indirectly heated cathode (IHC) or other designs known to those skilled in the art also may be used. The ion source 101 may be in an enclosure and may be connected to a gas box (not illustrated). The ion beam 110 is extracted from the ion source 101 into the process chamber 102 using extraction electrodes 114. The workpieces in the process chamber 102 are directly downstream of the extraction electrodes 114 in one instance. In one particular embodiment, the ion beam 110 is projected in a straight line from the ion source 101 toward the workpieces in the process chamber 102. An extraction aperture between the ion source 101 and process chamber 102 may be positioned between or proximate the extraction electrodes 114. As seen in FIG. 1, a wall proximate the extraction electrodes 114 is directly between the ion source 101 and process chamber 102.

The process chamber 102 may contain a scan robot or other workpiece transport system. A mask loader may be positioned in the process chamber 102 such that a mask can be placed in the path of the ion beam 110. For example, the mask may be placed on a carrier containing the workpieces. This mask may have dimensions large enough to cover multiple workpieces and may have apertures defining regions to be implanted in each workpiece. Thus, the mask at least partially covers the workpiece or workpieces and implantation of less than an entirety of a surface of each workpiece may be performed. In an alternate embodiment, the mask is fixed in the path of the ion beam 110 without being placed on the carrier. In yet another alternate embodiment, the mask is moveable in and out of the ion beam 110 without being placed on the carrier. The dimensions of the mask may enable the mask to cover 100% of the ion beam 110 or less than 100% of the ion beam 110, though apertures in the mask allow part of the ion beam to pass through to implant specific regions of the workpiece or workpieces. Thus, one of these regions may be less than an entirety of a workpiece surface. If the mask covers less than 100% of the ion beam 110, then both a blanket and selective implant of the workpieces may occur. In this instance, the blanket and selective implants may be separate or at least partially simultaneous. In one particular embodiment, the mask has dimensions large enough to cover multiple workpieces, which may be arranged in an array. The mask may have multiple sets of apertures, each set corresponding to one of the multiple workpieces.

A metrology system 103 also is disposed in the path of the ion beam 110. The metrology system 103 may be positioned behind a position where the workpieces are implanted and may only measure the ion beam 110 when workpieces are not being implanted, though other configurations are possible.

The process chamber 102 is connected to a transfer chamber 104 that contains at least one transfer robot 115. In one particular embodiment, two transfer robots are used in the transfer chamber 104. Each transfer robot may be, for example, a single arm robot. The transfer chamber 104 is connected to a load lock 105 and load lock 106 in this embodiment. The transfer robot 115 in the transfer chamber 104 is used to transport workpieces between process chamber 102 and the load lock 105 and load lock 106. In one instance, the transfer robot 115 can place the workpieces on a carrier in the process chamber 102. In another instance, the carrier is loaded with workpieces in the transfer chamber 104 or load lock 105 and moved to the process chamber 102 using the transfer robot 115.

The first load lock 105 is connected to the workpiece transport system 107 and the second load lock 106 is connected to the workpiece transport system 108. The workpiece transport systems 107, 108 are connected to the interface 109. The process chamber 102 and transfer chamber 104 may operate under vacuum while the workpiece transport systems 107, 108 may operate at atmospheric pressure or in atmosphere. The load lock 105 and load lock 106 are cycled between atmosphere and vacuum in one example.

The ion implanter 100 has two paths for loading and unloading workpieces from the process chamber 102. Workpieces, such as solar cells, may be loaded into the interface 109, such as using racks, cassettes, or carriers that contain stacks of workpieces. In one instance, the workpieces are transported to the load lock 106 using the workpiece transport system 108. The load lock 106 is pumped down to vacuum and the workpieces are transported to the transfer chamber 104. The workpieces are implanted in the process chamber 102, returned to the transfer chamber 104, and transported to the load lock 105. Once returned to atmosphere, the workpieces are transported using the workpiece transport system 107 back to the interface 109. In another embodiment, both the workpiece transport system 107 and workpiece transport system 108 load and unload workpieces because each has multiple conveyor belts that can operate going different directions. Of course, other process flows using the ion implanter 100 are possible and these are merely examples.

In an alternate embodiment, another load lock and workpiece transport system are attached to the transfer chamber 104. This additional workpiece transport system is attached to the interface 109. Adding this additional load lock and workpiece transport system will provide a third path for loading and unloading workpieces from the process chamber 102. Other additional load locks and workpiece transport systems may be used. In another alternate embodiment, the load lock 105 and load lock 106 each contain multiple chambers, each with its own aperture or port for loading or unloading.

The workpieces may be placed on a carrier for transport and implantation in the process chamber 102. The carrier may hold, for example, 16 workpieces in an array or matrix of 4×4 workpieces, though other numbers or arrangements are possible. The carrier may be fabricated of graphite, silicon carbide, or other materials. The carrier may be attached to and removed from another device in the process chamber 102, such as a scan robot, roll plat, or some other robot using mechanical force, magnetic force, or other mechanisms.

In one instance, a series of conveyors 111 and series of conveyors 112 are located between the interface 109 and part of the workpiece transport systems 107, 108 or load locks 105, 106. The series of conveyors 111, 112 may each contain three conveyor belts in one instance and each of the series of conveyors 111, 112 may be configured to transport a line of workpieces that is one workpiece in width. For example, the series of conveyors 112 may bring workpieces from the interface 109 to the load lock 106. A gantry robot, a gantry robot and swap robot, or some other robot in the workpiece transport system 108, for example, may load the workpieces from the series of conveyors 112 into the load lock 106. Likewise, a gantry robot, a gantry robot and swap robot, or some other robot in the workpiece transport system 107 may unload the workpieces from the load lock 105 onto the series of conveyors 111. In one specific embodiment, the gantry robot lifts four workpieces at a time from the series of conveyors 112 onto the swap robot for insertion into the load lock 106. This gantry robot or a different gantry robot also can lift four workpieces at a time from a swap robot to the series of conveyors 111. This gantry robot may use vacuum forces, electrostatic force, mechanical force, or some other mechanism to transport the workpieces and each gantry robot can load or unload workpieces. The series of conveyors 111, 112 may transfer the workpieces directly to or from the interface 109 or another set of conveyors may connect the series of conveyors 111, 112 to the interface 109. A handler robot may be included in the interface 109 to move, for example, cassettes to and from the series of conveyors 111, 112. More robots may be needed and some workpiece transfers may be between robots in order to meet throughput specifications.

While a specific embodiment of the workpiece transport system 108 and workpiece transport system 107 is disclosed, other designs are possible. Robots, conveyor belts, other mechanisms that transport workpieces or carriers, or a combination thereof also may be used.

Figure 2:
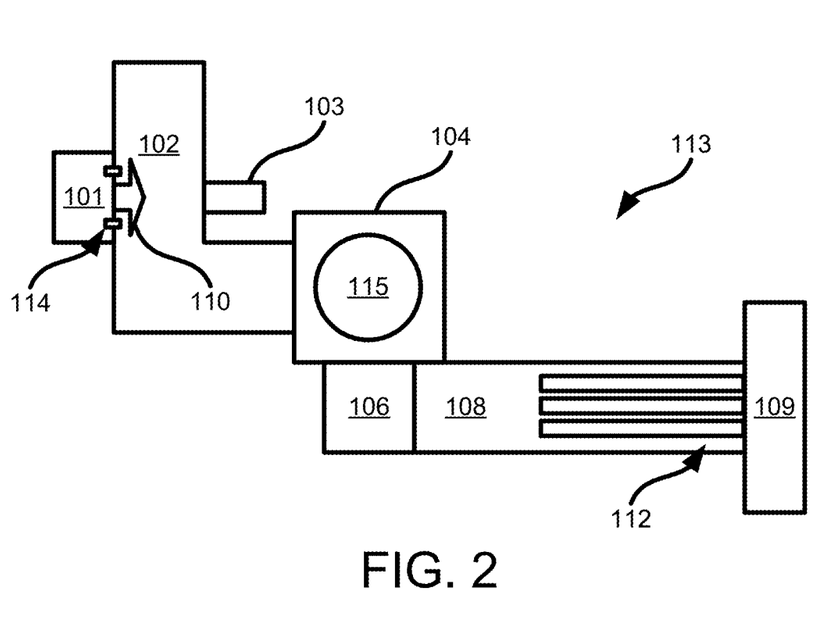
FIG. 2 is a top perspective view of a block diagram of a second embodiment of an ion implanter architecture.

FIG. 2 is a top perspective view of a block diagram of a second embodiment of an ion implanter architecture. This embodiment has only the load lock 106 and workpiece transport system 108. Thus, the ion implanter 113 has a single path for loading and unloading workpieces from the process chamber 102, but multiple carriers may be shuffled around the ion implanter 113 at least partially simultaneously. Each of the conveyor belts in the series of conveyors 112 may be capable of both loading and unloading in one embodiment. The ion implanter 113 may have a carrier storage area connected to the process chamber 102 or transfer chamber 104 in one particular embodiment.

Figure 3:
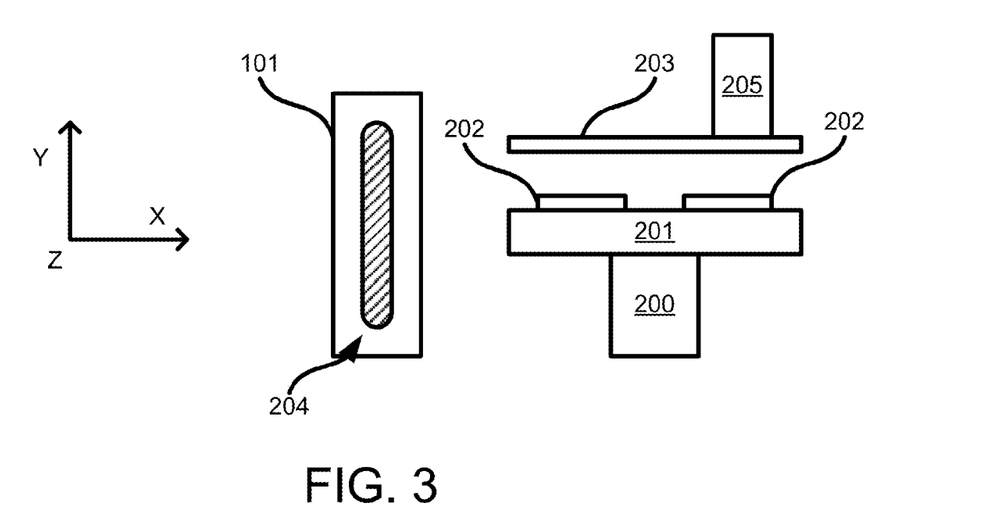
FIGS. 3-4 are a perspective view of a first embodiment of performing ion implantation using an implanter architecture embodiment disclosed herein.
Figure 4:
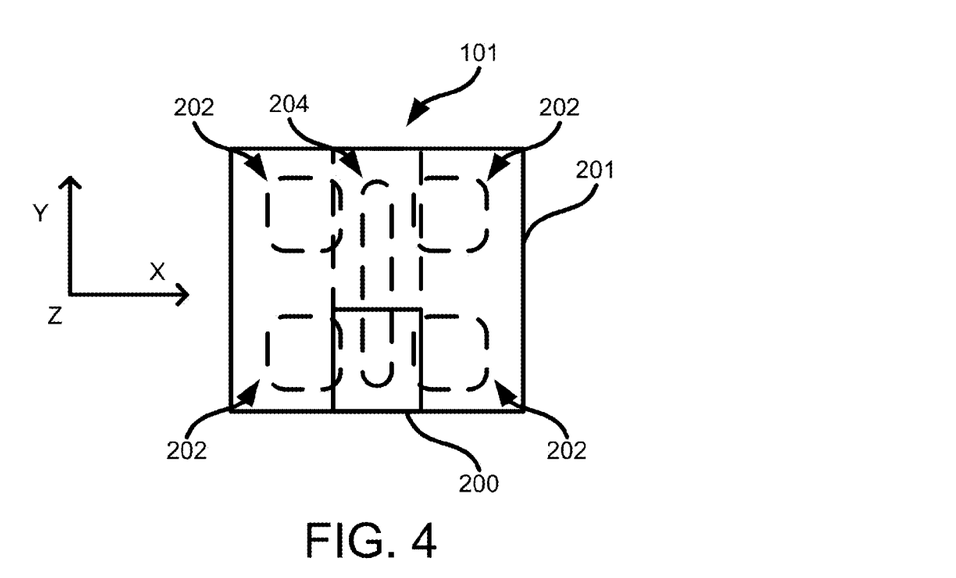

FIGS. 3-4 are a perspective view of a first embodiment of performing ion implantation using an implanter architecture embodiment disclosed herein. In FIG. 3, workpieces 202 are disposed on or in a carrier 201. The carrier 201 is disposed on a scan robot 200 that can rotate or tilt. This carrier 201 may physically or mechanically hold the workpieces 202, but the system also may use electrostatic clamping to position the workpieces 202. Thus, the scan robot 200 may include electrostatic clamps on one surface.

The ion source 101 has an extraction aperture 204 (shaded in FIG. 3). This extraction aperture 204 may have different designs than that shown in FIG. 3. The ion beam, such as the ion beam 110 of FIGS. 1-2, is projected out of the extraction aperture 204. Extraction electrodes may be located proximate the extraction aperture 204. The mask 203 is attached or connected to the carrier 201 in the y-direction using a mask loader 205 such that the apertures in the mask 203 are aligned to regions where selective implants are desired in the workpieces 202. The mask loader 205 may be a robotic, mechanical, or magnetic system that moves or manipulates the mask 203.

In one particular embodiment, the scan robot 200 has a horizontal load position where the carrier 201 is loaded onto the scan robot 200 or workpieces 202 are loaded into the carrier 201. The scan robot 200 also has a vertical implant position for implanting the workpieces 202 and scanning the workpieces 202 through the ion beam. The scan robot 200 may rotate between these two positions, which may be approximately perpendicular to each other. Of course, other angular relationships are possible.

The mask 203 is lowered onto the carrier 201 using the mask loader 205 in one particular embodiment. This mask loader 205 may be a single stage robot. The mask 203 may be connected to the carrier using mechanical fastening or clamping (such as a latch), magnetic fastening or clamping, or other mechanisms. The workpieces 202 may already be aligned within the carrier 201, so proper connection of the mask 203 to the carrier 201 may ensure that the desired implantation occurs.

In FIG. 4, the carrier 201 and workpieces 202 are rotated 90° such that the workpieces 202 are perpendicular to the direction of the ion beam extracted from the extraction aperture 204 (i.e., the z-direction). This rotation may use the scan robot 200. The workpieces 202 are scanned in the x-direction across the ion beam projected from the extraction aperture 204 such that each workpiece is implanted. Thus, the scan through or across the ion beam may be linear. After the implant, the mask 203 may be removed from the workpieces 202 or carrier 201, which may use the mask loader 205. The mask 203 may be attached to the carrier 201 or placed over the workpieces 202 in a first region of the process chamber. Opposite the first region in the x-direction (on the other side of the ion source 101) may be a second region of the process chamber. This second region may be used to temporarily store the workpieces 202 or also may have a mask loader 205 to attach or remove the mask 203.

Figure 5:
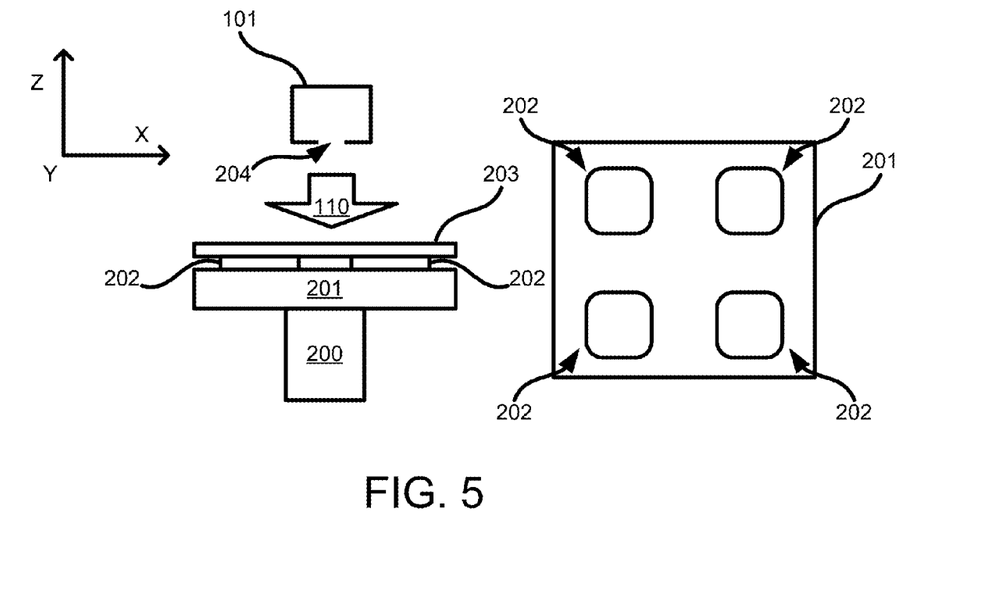
FIG. 5 is a top perspective view of the first embodiment of performing ion implantation illustrated in FIGS. 3-4.

FIG. 5 is a top perspective view of the first embodiment of performing ion implantation illustrated in FIGS. 3-4. On the right is the carrier 201 with four workpieces 202 on or in it. In other embodiments there may be more or fewer workpieces 202 on or in the carrier 201. Four example, sixteen workpieces 202 may be placed on or in the carrier 201 in one embodiment. A mask 203 is attached to the carrier 201 over the workpieces 202.

On the left of FIG. 5, the workpieces 202 are implanted by the ion beam 110. The ion beam 110 is extracted from the extraction aperture 204 of the ion source 101 in the z-direction. The workpieces 202 have been rotated or tilted by the scan robot 200 such that they are perpendicular to the z-direction. For example, the workpieces 202 may be tilted 90° to be positioned as illustrated on the left of FIG. 5. The carrier 201 may be scanned in the x-direction to implant the workpieces 202. Projecting the ion beam 110 in the z-direction (which may be perpendicular to gravity) simplifies the design of the ion implanter and also may reduce particle deposition on the workpieces 202. While only a single scanning axis is disclosed (x-direction), in an alternate embodiment scanning in two axes may be performed (such as in the x-direction and y-direction). Also, while the mask 203 is illustrated in FIG. 5 on the workpieces 202, there may be a gap between the mask 203 and workpieces 202.

In an alternate embodiment, the mask 203 is loaded onto the carrier 201 when the carrier is in the vertical position (i.e., when the workpieces 202 are perpendicular to the direction of the ion beam extracted from the extraction aperture 204). The mask 203 may be held on the wall of the process chamber using a mask loader that uses mechanical or magnetic forces before it is transferred to the carrier 201. This may be similar to the mask loader 205 illustrated in FIG. 3 or may use a different design that enables this particular transfer to the carrier 201.

While the carrier 201 is specifically disclosed, another embodiment does not use such a carrier 201. In this particular embodiment, the workpieces 202 are individually clamped to a platen or positioned on another platform of the scan robot 200 to hold the workpiece 202 during implant. One or more workpieces 202 may be clamped or held simultaneously. In one instance, an electrostatic clamp is used to hold the workpieces 202 during implant.

In one particular embodiment, the workpieces 202 are loaded onto or into the carrier 201 in a matrix. This matrix may be 2×2, 2×4, 4×4, or other sizes. Both a blanket implant and selective implant of the workpieces 202 may be performed. The scan robot 200 may be in a horizontal load position when the workpieces 202 are loaded onto or into the carrier 201 or the carrier 201 loaded on the scan robot 200. The scan robot 200 rotates the carrier 201 to a vertical implant position and scans the workpieces 202 through the ion beam 110, which transports the workpieces 202 in the x-direction to perform the blanket implant of an entirety of a surface of each workpiece 202. The ion beam 110 implants an entirety of each of the workpieces 202 during this blanket implant. In one instance, the scan robot 200 may rotate the carrier 201 back to the horizontal load position to load or connect the mask 203 onto the carrier 201 or over the workpieces 202. In another instance, the mask 203 is loaded or connected to the carrier 201 or over the workpieces 202 while the scan robot 200 is still in its vertical implant position. The scan robot 200 scans the workpieces 202 and mask 203 through the ion beam 110, which transports the workpieces 202 in the x-direction to perform the selective implant of regions of a surface of each workpiece 202 after the mask 203 is loaded or connected. The ion beam 110 implants a region of each of the workpieces 202 through the mask 203 during this selective implant. The mask 203 is the removed while the scan robot 200 is in either the horizontal load or vertical implant position. The workpieces 202 are unloaded or disconnected from the carrier 201 or the carrier 201 is unloaded from the scan robot 200 while the scan robot 200 is in a horizontal load position. Of course, the blanket implant and selective implant can be performed in either order provided that the mask 203 is loaded or connected prior to the selective implant and unloaded or disconnected prior to the blanket implant. In an alternate embodiment, two selective implants may be performed instead of a blanket and selective implant. This may require two different masks 203 to form two different implant patterns.

Figure 6:
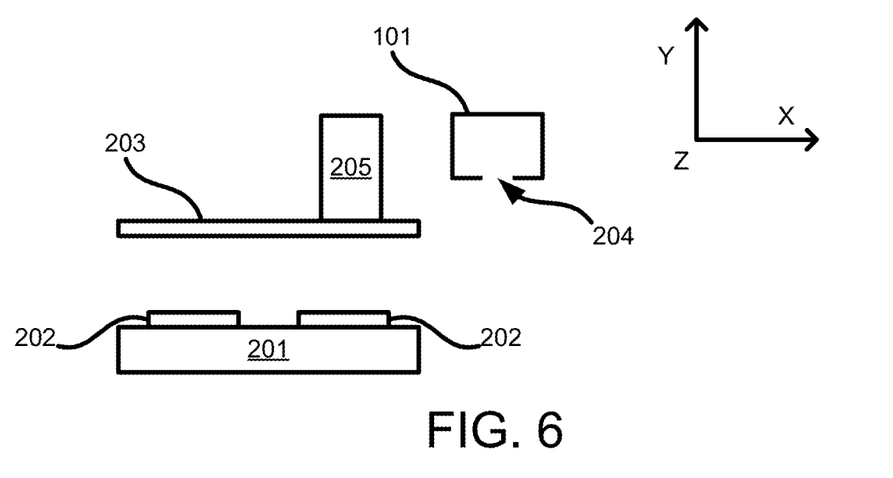
FIGS. 6-7 are a perspective view of a second embodiment of performing ion implantation using an implanter architecture embodiment disclosed herein.
Figure 7:
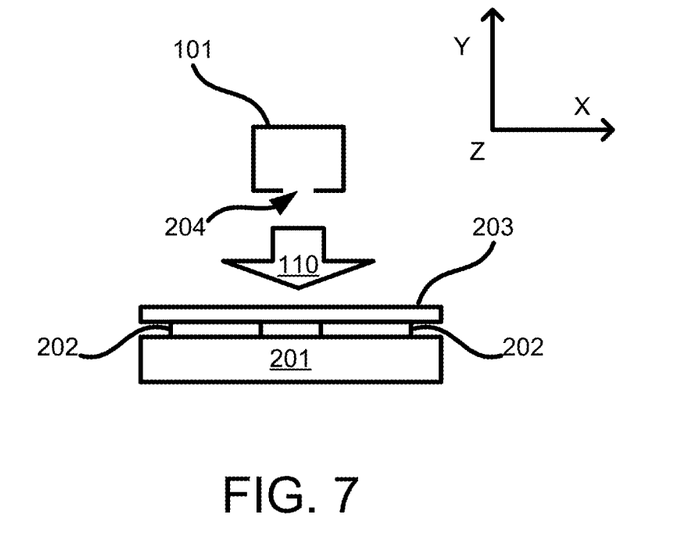

FIGS. 6-7 are a perspective view of a second embodiment of performing ion implantation using an implanter architecture embodiment disclosed herein. In this embodiment, the ion source 101 is disposed above the workpieces 202 or the process chamber in the y-direction (i.e., the ion beam 110 is projected in a direction approximately parallel with gravity). In FIG. 6, the mask 203 is attached or connected to the carrier 201 in the y-direction with, for example, a mask loader 205 such that the apertures in the mask 203 are aligned to regions where selective implants are desired in the workpieces 202. In FIG. 7, the workpieces 202 are scanned in the x-direction such that each is implanted. After the implant, the mask 203 may be removed from the workpieces 202 or carrier 201, such as using the mask loader 205. This may be performed in a first region of the process chamber. Opposite the first region in the x-direction (on the other side of the ion source 101) may be a second region of the process chamber. This second region may be used to temporarily store the workpieces 202 or also may have a mask loader 205 to attach or remove the mask 203.

If a blanket implant is desired using the embodiments described herein, then the mask 203 is not used. In this instance, the workpieces 202 scan through the ion beam extracted from the extraction aperture 204 without a mask 203. In some embodiments, both blanket and selective implants are desired. A blanket implant and selective implant using a mask 203 may both be performed without breaking vacuum around the workpieces 202 depending on the sequence of the implants. For example, a blanket implant may be performed, then the mask 203 is attached to or over the carrier 201 and a selective implant is performed. In another example, the mask 203 is attached to or over the carrier 201, a selective implant is performed, the mask 203 is removed from the carrier 201, and then a blanket implant is performed. One or more passes through the ion beam 110 may be necessary to obtain a desired dose during blanket or selective implantation.

In an alternate embodiment, a sheath modifier with apertures is placed on or in the ion source instead of using the mask or to supplement the mask. This sheath modifier causes the ions to be focused into a selective implant by affecting the plasma sheath. The scan speed of the workpieces with respect to the ion source or the beam current may be varied to perform a selective implant or a combination of blanket and selective implant. The shape of the apertures in the sheath modifier also can be varied to perform a selective and blanket implant or just a blanket implant. Other focused ion beam systems may be used with the ion source to provide selective implants.

The embodiments described herein may operate at a throughput of approximately 3000 wafers per hour (wph) for blanket implants or approximately 2000 wph for selective implants. Of course, other throughputs are possible. In certain configurations, an ion implanter as disclosed herein may operate up to 6000 wph.

One embodiment features workpiece cooling. Backside gas cooling may be used in one embodiment and a backside gas cooling system may be part of the carrier 201 or scan robot 200, for example. The workpieces may be kept below 300° C. or 200° C., for example. Phosphorus, arsenic, boron, other n-type dopants, other p-type dopants, metals, or other species known to those skilled in the art may be implanted. The implant dose may be in the E15 $cm^{-2}$ range, though other implant doses are possible. The implanted features using a mask or using other selective implant methods may be less than approximately 300 μm in dimension. In the embodiments herein, the ion beam is not mass analyzed. However, in an alternate embodiment the beamline attached to the process chamber 102 has a mass analyzer included. In one such embodiment, the ion beam is curved or deflected to remove undesired ion species or ions with an undesired energy. This may reduce contamination for certain implant processes. One of the ion sources illustrated herein also may be modified or configured to provide deposition, etching, or other capabilities.

Figure 8:
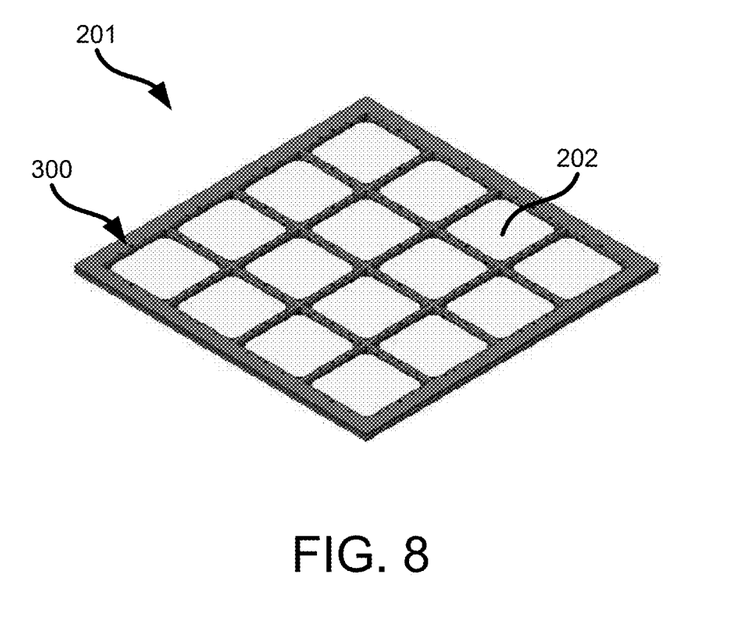
FIGS. 8-10 are perspective views of an embodiment of a carrier.
Figure 9:
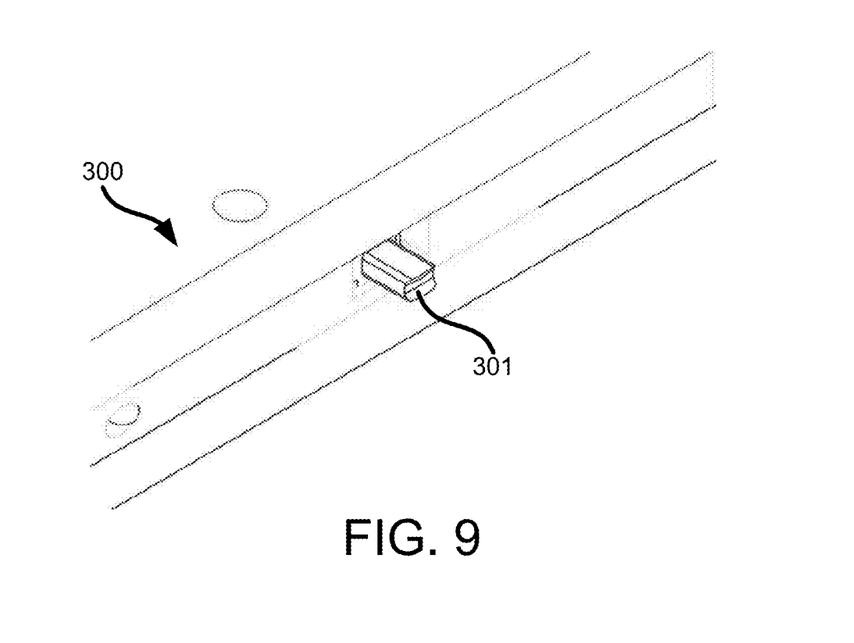
Figure 10:
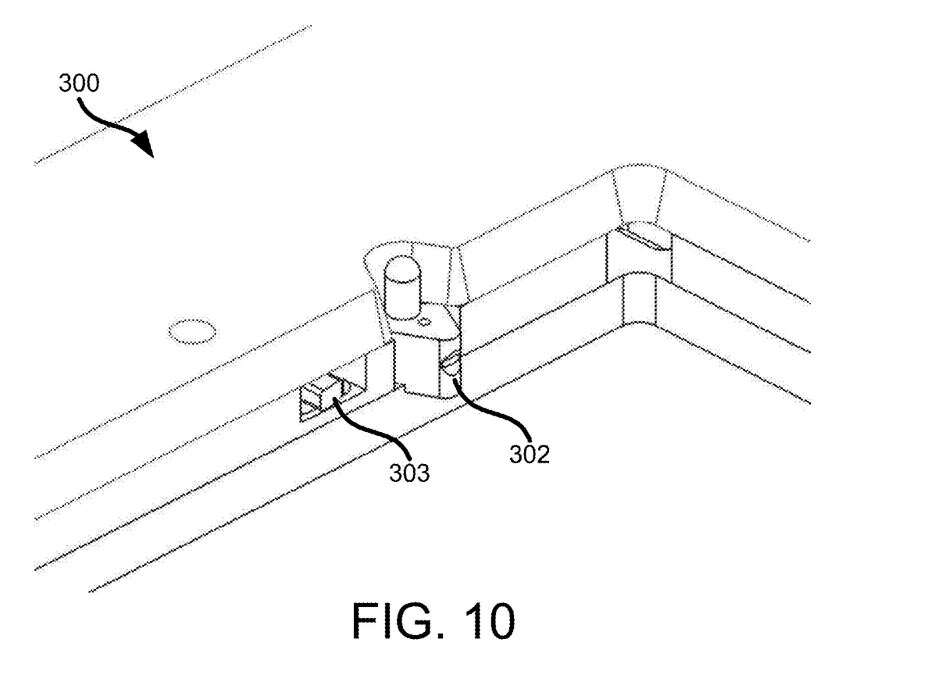

FIGS. 8-10 are perspective views of an embodiment of a carrier. The carrier 201 in FIG. 8 has 16 workpieces 202 in a 4×4 matrix. Each workpiece 202 is surrounded by a frame 300. The carrier 201 may include a base on the side of the carrier 201 opposite of where the workpieces 202 are loaded in one embodiment. In another embodiment, the frame 300 is open on both sides.

Each frame 300 may include one or more pushers 301, as seen in FIG. 9. This pusher 301 may be connected to a spring-loaded rotary arm. When extended, the pusher 301 will move the workpiece 202 against the opposite wall of the frame 300. In one instance, two adjacent walls of the frame 300 have one or more pushers 301 each. This will move the workpiece 202 against the opposite wall or walls of the frame 300 from the pushers 301. This may enable alignment by pressing the workpiece 202 into a corner or against a wall. The pushers 301 may have a grooved or curved end that touches the workpiece 202 to help retain or grip the workpiece 202.

As seen in FIG. 10, the frame 300 also may include one or more retention mechanisms 302. These retention mechanisms 302 may be a retention pin in one embodiment. Each retention mechanism 302 may have a grooved or curved end that touches the workpiece 202 to help retain or grip the workpiece 202. The pusher 301 may work with the retention mechanism 302 to hold the workpiece 202 in the frame 300. The frame 300 also may include one or more release mechanisms 303, which may push the workpiece 202 out of the retention mechanism 302 in one instance.

Figure 11:
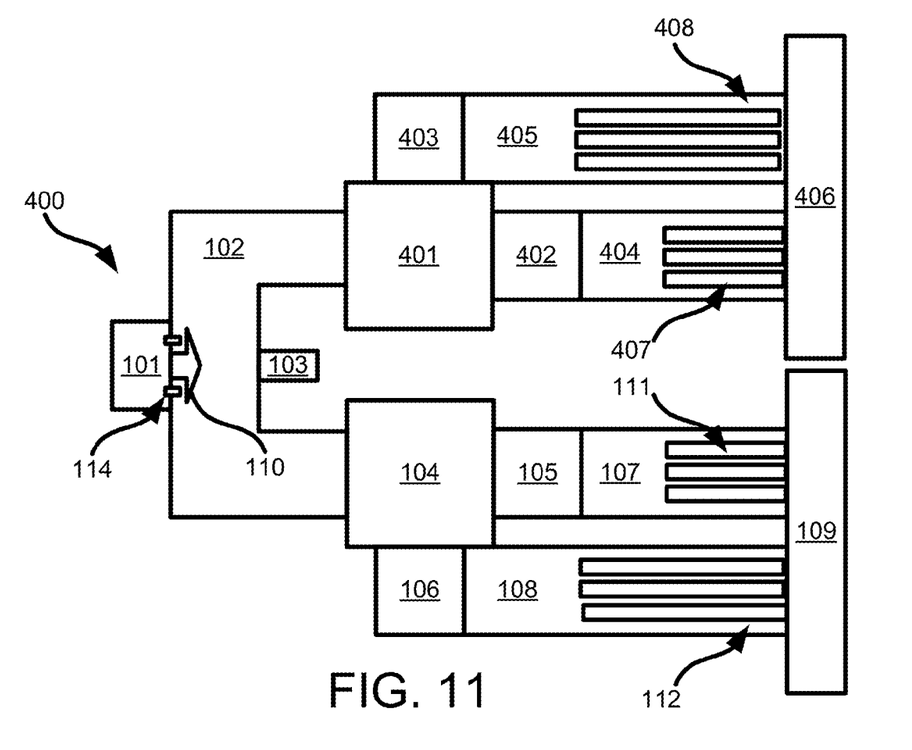
FIG. 11 is a top perspective view of a block diagram of a third embodiment of an ion implanter architecture.

FIG. 11 is a top perspective view of a block diagram of a third embodiment of an ion implanter architecture. Part of this embodiment is similar to the embodiment of FIG. 1. However, the ion implanter 400 includes a second transfer chamber 401 connected to load locks 402, 403. The transfer chamber 104 and second transfer chamber 401 may each have at least one transfer robot (not illustrated), which may be similar to the transfer robot 115. The load locks 402, 403 are connected to the workpiece transport systems 404, 405, each with a series of conveyors 407, 408. The workpiece transport systems 404, 405 may be similar to the workpiece transport systems 107, 108. The workpiece transport systems 404, 405 are connected to the interface 406. A gantry robot, some other robot, or a combination of robots in the workpiece transport systems 404, 405 may load the workpieces between the series of conveyors 407, 408 and the load locks 402, 403. This embodiment enables multiple input and output paths for the workpieces. Carriers can be cycled in and out of the process chamber 102 in one or two directions.

Figure 12:
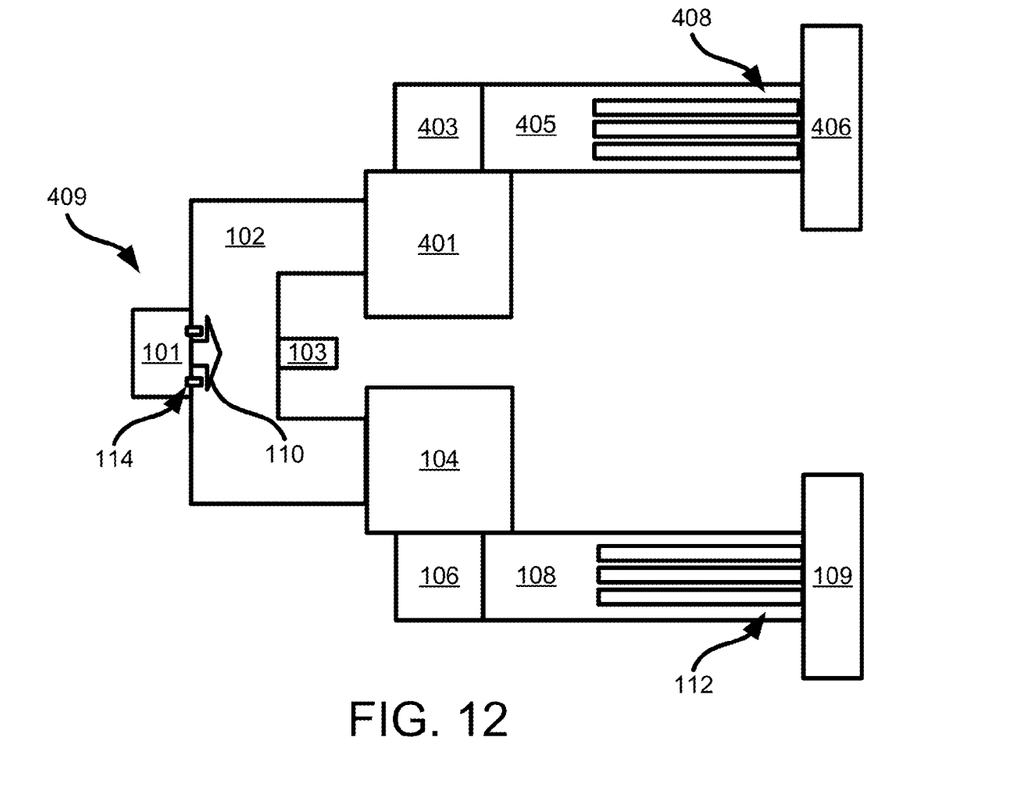
FIG. 12 is a top perspective view of a block diagram of a fourth embodiment of an ion implanter architecture.

FIG. 12 is a top perspective view of a block diagram of a fourth embodiment of an ion implanter architecture. This embodiment is similar to FIG. 11, but only has the workpiece transport system 405 connecting the load lock 403 to the interface 406 and the workpiece transport system 108 connecting the load lock 106 to the interface 109. This ion implanter 409 may enable multiple input and output paths for the workpieces. In one instance, one of the workpiece transport systems 108, 405 is for loading workpieces while the other is for unloading workpieces. In another instance, the workpiece transport systems 108, 405 are each used for loading and unloading workpieces.

The interface 406 in the embodiments of FIGS. 11-12 also may be the same as or connected to the interface 109. Thus, it may be part of the same unit and may share robots used to load or unload cassettes. Of course, the interface 406 also may be separate from the interface 109 as is illustrated in FIGS. 11-12.

The embodiments disclosed herein may hold multiple carriers. These carriers may be cycled or stored in various locations during implant and loading or unloading of workpieces. The embodiment of FIG. 2 may use five carriers. The embodiment of FIG. 1 may use eight carriers. The embodiment of FIG. 12 may use 10 carriers. The embodiment of FIG. 11 may use 16 carriers. Of course, more or fewer carriers may be used in each embodiment. These numbers are merely meant to be illustrative.

Figure 13:
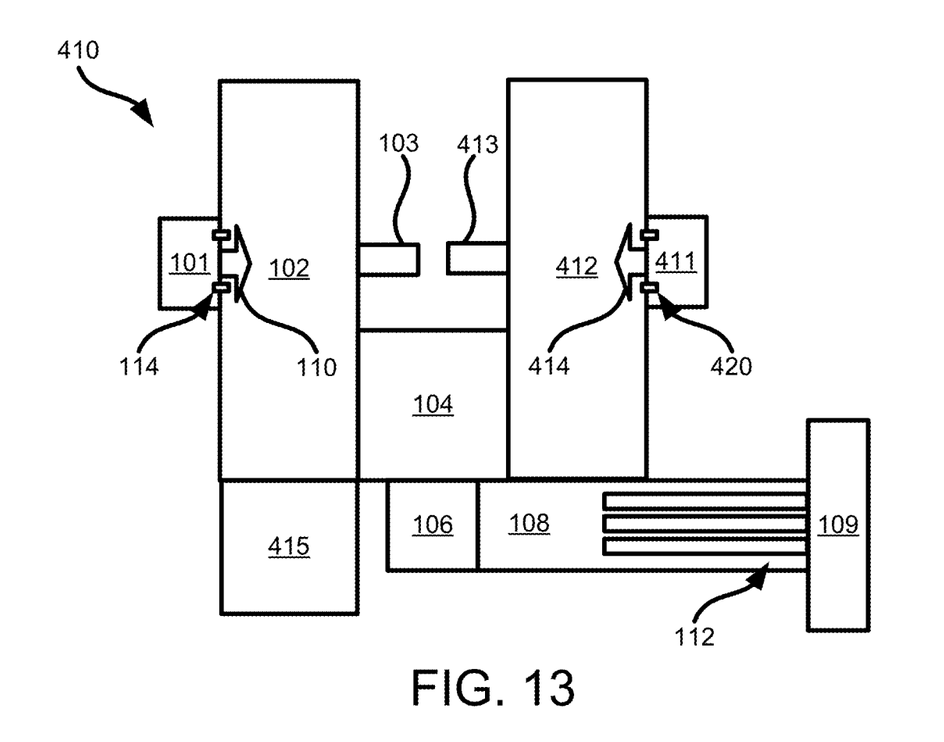
FIG. 13 is a top perspective view of a block diagram of a fifth embodiment of an ion implanter architecture.

FIG. 13 is a top perspective view of a block diagram of a fifth embodiment of an ion implanter architecture. The ion implanter 410 has a process chamber 102 and process chamber 412. Both are connected to the transfer chamber 104, which may have a transfer robot (not illustrated) similar to the transfer robot 115. The process chamber 412 has an ion source 411 that generates an ion beam 414. The process chamber 412 also has a metrology system 413. The process chamber 412, ion source 411, and metrology system 413 may be similar to the process chamber 102, ion source 101, and metrology system 103, respectively. The process chamber 102 in this instance is connected to a carrier storage area 415. More than one carrier storage area 415 may be used in the ion implanter 410, though only one is illustrated in FIG. 13. For example, the process chamber 102 may be connected to two carrier storage areas 415.

The workpieces in the process chamber 412 are directly downstream of the extraction electrodes 420 in one instance. In one particular embodiment, the ion beam 414 is projected in a straight line from the ion source 411 toward the workpieces in the process chamber 412. An extraction aperture between the ion source 411 and process chamber 412 may be positioned between or proximate the extraction electrodes 420. As seen in FIG. 13, a wall proximate the extraction electrodes 420 is directly between the ion source 411 and process chamber 412.

The process chambers 102, 412 in the ion implanter 410 may each perform blanket and selective implants, two blanket implants, or two selective implants. Different implant species or the same implant species may be used for each ion beam 110, 414. The two selective implants may implant different regions of the workpiece with one region formed in each process chamber 102, 412. Thus, the masks used for these two selective implants may be different. All these implants may be performed without breaking vacuum around a workpiece. Other embodiments disclosed herein also may have two or more process chambers attached in a similar manner. The various transfer chambers may be connected such that each transfer chamber is connected to each process chamber. Of course, there also may be an instance where one transfer chamber may only connect to one of two process chambers.

In one instance, two process chambers and two transfer chambers may form a ring-shaped path with load locks and workpiece transport systems connected to the transfer chambers. Thus, the extra transfer chamber may join the process chambers 102, 412 illustrated in FIG. 13. The workpieces may cycle through an entire ring-shaped path or may cycle only through half the ring-shaped path. Two workpiece flows may improve uptime and throughput. Thus, the workpieces in an implanter that uses two workpiece flows may enter and exit the same transfer chamber without passing through the other transfer chamber. In this example, the workpieces are implanted by both ion sources, but are cycled back to original transfer chamber.

In yet another instance, two process chambers may be linked in a ring-shaped path and blanket and selective implants may occur in each process chamber. Thus, a total of four implants may be performed on each workpiece. Each ion source may implant a different ion species. The workpieces may cycle through both transfer chambers and may either exit through the original transfer chamber or the other transfer chamber. Each process chamber may perform both selective and blanket implants on the same workpieces. Thus, there may be two flows of workpieces and the cycling may compensate for placement or removal of the mask for the selective implant.

Figure 14:
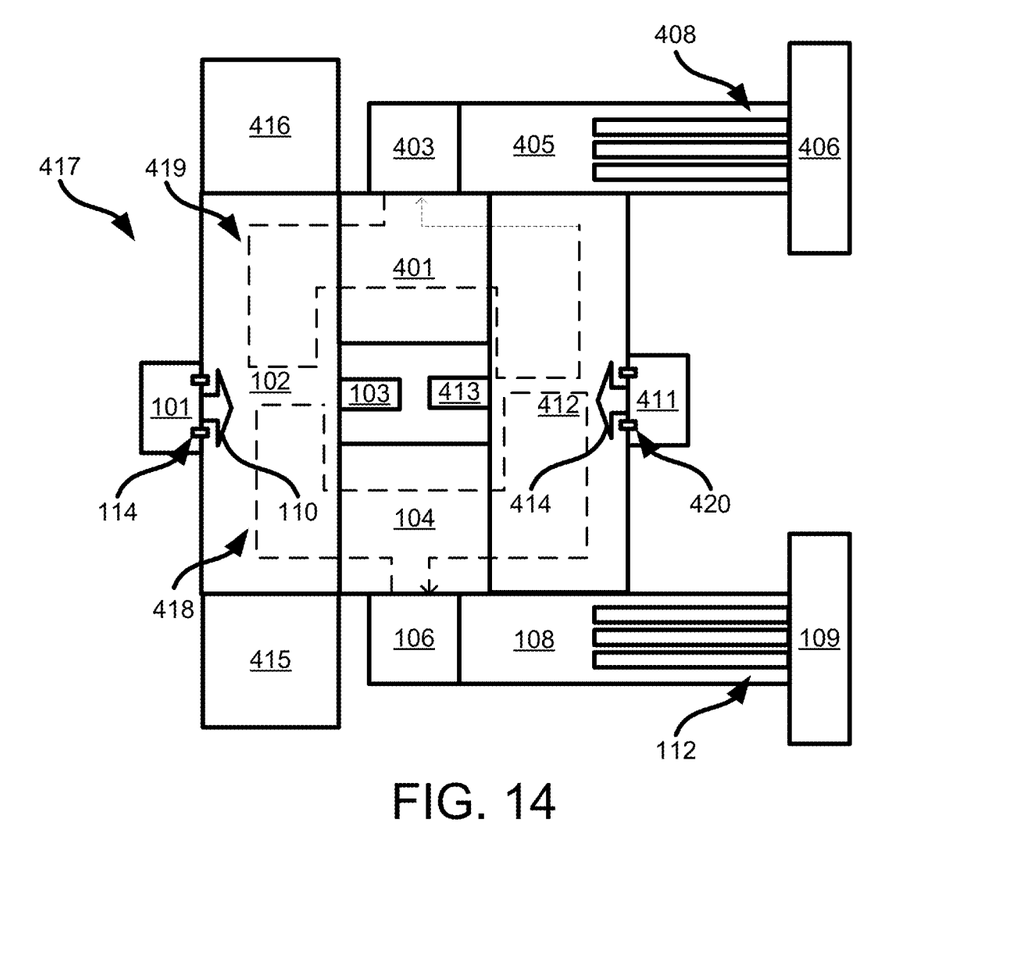
FIG. 14 is a top perspective view of a block diagram of a sixth embodiment of an ion implanter architecture.

FIG. 14 is a top perspective view of a block diagram of a sixth embodiment of an ion implanter architecture. The ion implanter 417 has two process chambers 102, 412, two transfer chambers 104, 401, and two carrier storage areas 415, 416. The ion implanter 417 can operate using parallel paths such that a single point failure does not stop the entire ion implanter 417 from operating. This will increase uptime on the ion implanter 417. Another advantage is that workpieces can enter and exit at the same location. The ion implanter 417 may have higher ion beam utilization because a first set of workpieces can be waiting for a second set of workpieces to be implanted and immediately begin the implant while the second set of workpieces is waiting or transported elsewhere and replaced by a third set of workpieces. Implanting the first set of workpieces while the other set of workpieces is loaded or unloaded may increase throughput.

These parallel paths are illustrated by the dotted lines 418, 419 of FIG. 14. Each set of workpieces enters from load lock 403 or load lock 106. This set of workpieces returns to the same load lock to be removed from the ion implanter 417.

It may be possible to implant one set of workpieces from one path while other sets of workpieces from either path are circulating within the ion implanter 417. The timing and sequencing of the workpiece movement, loading, unloading, and implantation may be configured to provide the highest throughput. In one embodiment, the ion beam 110 and the ion beam 414 use different implant species, though the ion beams 110, 414 also could use the same implant species. In another embodiment, each set of workpieces makes multiple implant passes past each ion source 101, 411 to obtain the desired implant dose or to obtain a blanket and selective implant from each ion source 101, 411. Of course, the workpieces may enter and leave the ion implanter through different load locks 106, 403 if this increases throughput or if there is a breakage or error within the ion implanter 417.

A similar ion implanter with two workpiece flows may only have one ion source and one process chamber, as illustrated in FIGS. 11-12. The workpieces may enter and exit the same transfer chamber without passing through the other transfer chamber. The single process chamber may perform both selective and blanket implants on the same workpieces. Thus, there may be two flows of workpieces and the cycling may compensate for placement or removal of the mask for the selective implant.

If chained implants are performed, a flip station may be included. This may flip a carrier 180° (such as if it does not include a base) or may flip the workpieces 180° and place these workpieces in a different carrier or back in the same carrier. A robot may be used to flip the workpieces or carrier. Flipping enables implantation of both sides of the workpieces, which may be needed for some solar cell designs. The workpieces in one embodiment may enter the ion implanter with one surface facing up and exit the ion implanter with the opposite surface facing up.

The flip station may be connected to the process chambers under the same vacuum conditions, may be connected to a transfer station under the same vacuum conditions, or may be connected outside of vacuum. For example, the transfer station may be connected to a flip station by an external conveyor. In one particular embodiment, the carrier storage area 415 of FIG. 13 or carrier storage areas 415, 416 of FIG. 14 also can function as a flip station.

The embodiments disclosed herein may operate in a chained or non-chained manner. An ion implanter that can perform chained implants may be able to perform a blanket and selective implant, two blanket implants, two selective implants, or other combinations of two or more implants in the same process chamber or process chambers without breaking vacuum. Using a single ion implanter that performs chained implants may, for example, reduce manufacturing equipment footprint in a manufacturing facility, use fewer replacement or consumable parts, or lower the overall cost because fewer conveyors or other components may be needed. Both chained and non-chained ion implanters using the embodiments described herein may have increased throughputs compared to existing ion implanters.

The various components disclosed herein (e.g., workpiece transport systems, transfer chambers) may be modular. Thus, standard components may be combined into different configurations. These different configurations will have different throughputs and may be used to perform different types of implants or to implant different types of workpieces.

In one instance, a single ion implanter may be used to manufacture selective emitter (SE) solar cells. This may use a blanket and a selective implant. In another instance, a single ion implanter may be used to manufacture interdigitated backside contact (IBC) solar cells. This may use at least two selective implants, each with a different implant species. However, some SE and IBC solar cells use more implant steps than this. Other solar cell designs also may be implanted using the implanter designs described herein.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter comprising:
   an ion source;
   a process chamber connected to said ion source and separated from said ion source by a plurality of extraction electrodes;
   a carrier configured to hold a plurality of workpieces and to be removably attachable to a scan robot;
   the scan robot configured to transport said carrier through an ion beam directed from said ion source; and
   a mask loader in said process chamber, wherein said mask loader is configured to connect a mask to said carrier while said carrier is disposed on said scan robot, wherein said mask has dimensions large enough to cover said plurality of workpieces.

2. The ion implanter of claim 1, wherein said ion source comprises an RF ion source.

3. The ion implanter of claim 1, wherein said mask is magnetically fastened to said carrier.

4. The ion implanter of claim 1, wherein said mask is mechanically fastened to said carrier.

5. The ion implanter of claim 1, wherein said scan robot has a horizontal load position and a vertical implant position that are perpendicular to one another, and said scan robot is configured to rotate said carrier from said horizontal load position to said vertical implant position so said plurality of workpieces are in a path of said ion beam.

6. The ion implanter of claim 1, wherein said plurality of workpieces are directly downstream of said extraction electrodes.

7. The ion implanter of claim 1, wherein an ion beam is projected in a straight line from said ion source toward said plurality of workpieces.

8. An ion implanter comprising:
   an ion source;
   a process chamber connected to said ion source and separated from said ion source by a plurality of extraction electrodes;
   a carrier configured to hold a plurality of workpieces and to be removably attachable to a scan robot;
   the scan robot configured to transport said carrier holding said plurality of workpieces through an ion beam directed from said ion source;
   a mask loader in said process chamber, wherein said mask loader is configured to connect a mask to said carrier while said carrier is disposed on said scan robot;

a transfer chamber connected to said process chamber;
a load lock connected to said transfer chamber;
a transfer robot in said transfer chamber configured to load said plurality of workpieces on said carrier and to transport said plurality of workpieces between said load lock and said process chamber; and
a workpiece transport system connected to said load lock and configured to load and unload said plurality of workpieces from said load lock, wherein said mask has dimensions large enough to cover said plurality of workpieces.

9. The ion implanter of claim 8, wherein said ion source comprises an RF ion source.

10. The ion implanter of claim 8, wherein said mask is magnetically fastened to said carrier.

11. The ion implanter of claim 8, wherein said mask is mechanically fastened to said carrier.

12. The ion implanter of claim 8, wherein said scan robot has a horizontal load position and a vertical implant position that are perpendicular to one another, and wherein said scan robot is configured to rotate said carrier from said horizontal load position to said vertical implant position so said plurality of workpieces are in a path of said ion beam.

13. The ion implanter of claim 8, further comprising a second load lock connected to said transfer chamber.

14. An ion implanter comprising:
a first ion source;
a second ion source, wherein one of said ion source and said second ion source generates n-type ions and another of said ion source and said second ion source generates p-type ions;
a first process chamber connected to said ion first source and separated from said first ion source by a plurality of extraction electrodes;
a carrier configured to hold a plurality of workpieces;
a first mask loader in said first process chamber, wherein said first mask loader is configured to connect a mask to said carrier;
a transfer chamber connected to said first process chamber;
a load lock connected to said transfer chamber;
a transfer robot in said transfer chamber configured to transport said plurality of workpieces between said load lock and said first process chamber;
a second process chamber connected to said transfer chamber and said second ion source, wherein said second process chamber is separated from said second ion source by a second plurality of extraction electrodes;
a second mask loader in said second process chamber, wherein said second mask loader is configured to connect a second mask to said carrier; and
a workpiece transport system connected to said load lock and configured to load and unload said plurality of workpieces from said load lock.

15. The ion implanter of claim 14, further comprising a second transfer chamber connected to said process chamber and said second process chamber.

16. The ion implanter of claim 8, wherein said plurality of workpieces are directly downstream of said extraction electrodes.

17. The ion implanter of claim 8, wherein an ion beam is projected in a straight line from said ion source toward said plurality of workpieces.

* * * * *